(12) United States Patent
Alm et al.

(10) Patent No.: US 8,537,549 B2
(45) Date of Patent: Sep. 17, 2013

(54) HOUSING FOR ELECTRONIC DEVICE

(75) Inventors: Carl-Axel Alm, Lund (SE); Magnus Sjoberg, Lomma (SE); Samir Helaoui, Malmo (SE)

(73) Assignee: Axis AB, Lund (SE)

( * ) Notice: Subject to any disclaimer, the term of this patent is extended or adjusted under 35 U.S.C. 154(b) by 214 days.

(21) Appl. No.: 13/128,018

(22) PCT Filed: Oct. 27, 2009

(86) PCT No.: PCT/EP2009/064151
§ 371 (c)(1),
(2), (4) Date: May 6, 2011

(87) PCT Pub. No.: WO2010/052154
PCT Pub. Date: May 14, 2010

(65) Prior Publication Data
US 2011/0216504 A1    Sep. 8, 2011

Related U.S. Application Data

(60) Provisional application No. 61/114,213, filed on Nov. 13, 2008.

(30) Foreign Application Priority Data

Nov. 6, 2008 (EP) .................................. 08168504

(51) Int. Cl.
*H05K 7/20* (2006.01)
(52) U.S. Cl.
USPC ................. 361/695; 361/679.48; 361/679.49; 361/679.5; 361/690; 361/694; 165/80.3; 165/104.33; 165/121; 165/185; 454/184

(58) Field of Classification Search
USPC ....... 361/679.46–679.54, 690–697, 700–715; 165/80.3, 104.33, 185; 174/50, 50.52, 520; 312/223.1, 223.2; 348/143, 373, E5.026; 454/184
See application file for complete search history.

(56) References Cited

U.S. PATENT DOCUMENTS 3,141,987 A * 7/1964 Altman ........................... 313/17
4,259,843 A * 4/1981 Kausch ........................... 62/3.1
(Continued)

FOREIGN PATENT DOCUMENTS

EP    0 746 192    12/1996
EP    0 944 297    9/1999
(Continued)

OTHER PUBLICATIONS

International Search Report issued Feb. 26, 2010 in PCT/EP09/64151 filed Oct. 27, 2009.
(Continued)

*Primary Examiner* — Michail V Datskovskiy
(74) *Attorney, Agent, or Firm* — Oblon, Spivak, McClelland, Maier & Neustadt, L.L.P.

(57) ABSTRACT

A housing for an electronic device. The housing includes a first shell at least partly enclosing the electronic device, a second shell, and at least a first fan. The first shell is arranged to allow a gaseous fluid to surround the electronic device. The second shell at least partly encloses the first shell, and is arranged in relation to the first shell such that the gaseous fluid may be present between the shells. The at least first fan is arranged in an opening of the first shell such that it is capable of providing a flow of the gaseous fluid through the opening in the first shell of the gaseous fluid to the second shell and thereby provide heat transport from the electronic device to the second shell.

14 Claims, 3 Drawing Sheets

(56) References Cited

U.S. PATENT DOCUMENTS

| | | | |
|---|---|---|---|
| 4,414,576 A * | 11/1983 | Randmae | 348/373 |
| 4,419,716 A | 12/1983 | Koo | |
| 4,984,089 A | 1/1991 | Stiepel et al. | |
| 5,563,659 A * | 10/1996 | Bernhardt et al. | 348/373 |
| 5,688,169 A | 11/1997 | Duong et al. | |
| 5,773,755 A * | 6/1998 | Iwatare | 174/17 VA |
| 5,864,365 A * | 1/1999 | Sramek et al. | 348/373 |
| 6,050,327 A * | 4/2000 | Gates | 165/80.3 |
| 6,101,090 A * | 8/2000 | Gates | 361/690 |
| 6,149,254 A | 11/2000 | Bretschneider et al. | |
| 6,803,962 B1 * | 10/2004 | Elberbaum et al. | 348/373 |
| 6,877,551 B2 * | 4/2005 | Stoller | 165/47 |
| 7,583,314 B2 * | 9/2009 | Kajihara et al. | 348/373 |
| 7,762,731 B2 * | 7/2010 | Arbuckle et al. | 396/427 |
| 2005/0213306 A1* | 9/2005 | Vos et al. | 361/714 |

FOREIGN PATENT DOCUMENTS

| | | | |
|---|---|---|---|
| JP | 407221478 A | * | 8/1995 |
| JP | 408125894 A | * | 5/1996 |
| JP | 8-330768 A | | 12/1996 |
| JP | 2007-306308 A | | 11/2007 |

OTHER PUBLICATIONS

European Search Report issued Apr. 2, 2009 in EP 08168504 filed Nov. 6, 2008.

Office Action issued Jan. 9, 2013 in Japanese Patent Application No. 2011-535074 English language translation only.

* cited by examiner

HOUSING FOR ELECTRONIC DEVICE

TECHNICAL FIELD

The present invention relates to a housing for electronic devices, where the housing is adapted for cold and hot environments, particularly outdoor.

BACKGROUND

When making a housing for an electronic device for use in outdoor environments, an important consideration is that the housing should be able to cope with large differences in temperature. That is, the housing should be adapted to both cold and hot environments. Much focus is hence needed on insulation and power consumption, and from a economical and environmental perspective it is desirable to keep power consumption at a low level.

Protective housings for electronic devices for outdoor environments usually have a single sealed shell for the purpose of protecting the electronic devices inside the shell. Heat in the shell generated by the electronic device can easily be conducted through the shell if the external air temperature is low. However, when the external temperature is high or the shell is heated by solar radiation, the internal temperature will rise due to the generated heat from the electronic device and the external heat. A solution to such a problem may be to arrange a sunshade or adding a shell outside the sealed shell.

Conventional double shell housings for electronic devices use air between the shells to prevent the external heat to reach into the inner shell. A ventilation opening is typically provided in the outer shell, and provide a natural convection of the air if the inside of the inner shell is heated by the electronic device to a higher temperature than the external temperature. Another way is to manufacture shells in a heat conducting material so as to facilitate transmission of heat, which is generated by the electronic device, to the outside in order to keep the internal temperature down.

Likewise, in conventional double shell housings, the air between the shells may be useful in cold environments, as the air between the shells is applied as an insulation to maintain a convenient tempered environment inside the inner shell around the electronic device.

In such double shell housings using natural convection and an opening in the outer shell, however, there is a problem with a non-effective heat transportation both from the inside of the inner shell and also between the inner and outer shell.

EP 0746 192 A1 addresses this problem by using a plurality of fans provided between an inner and an outer shell, where the inner shell is hermetically sealed and the outer shell has bimetal valves for support of circulation with the environment outside the outer shell. However, EP 0746 192 A1 has a drawback, in that the fans and any electronics connected to the fans will be exposed to the outside environment. If the outside environment is cold and damp, this will lead to damages to the fans and any connected electronics.

In U.S. Pat. No. 4,984,089 an outdoor surveillance apparatus is disclosed which support movement of a camera assembly. The apparatus is adapted to low and high temperature by use of a heater and multiple fans which are regulated by thermostats.

U.S. Pat. No. 4,419,716 disclose a sealed vapor proof housing with a system for isolating an electrical device from ambient atmosphere. Heat is transferred by use of a fan and that the housing made of metal consists of a multiple number of heat exchange fins.

SUMMARY

In order to improve on prior art solutions there is provided, according to a first aspect, a housing for an electronic device comprising a first shell, a second shell and at least a first fan. The first shell, which has at least one opening, at least partly encloses the electronic device and is arranged to allow a gaseous fluid to surround the electronic device. The second shell, that at least partly encloses the first shell, is arranged in relation to the first shell such that the gaseous fluid may be present between the shells. In relation to the first and second shells, at least a first fan is arranged such that it is capable of providing a flow of the gaseous fluid through the at least one opening in the first shell to the second shell and thereby provide heat transport from the electronic device to the second shell.

In other words, the drawbacks as discussed above are addressed by providing an opening in the first shell which enables a flow of heat between the shells. This will keep the surrounding of the electronic device at a convenient temperature. When the fan is running, the heat transport from the first shell to the gaseous fluid between the shells is improved and when the fan is not running, the gaseous fluid between the shells functions as a heat insulator. When the surrounding environment is cold, and the fan is off, a layer of gaseous fluid is kept between the shells to keep the heat inside the first shell. Hence, the housing can be optimized for both cold and hot environments.

Embodiments of the housing include those where the housing is sealed with respect to a surrounding environment and embodiments where the first fan is arranged at the opening in the first shell. A sealed housing improves insulation from contamination in hostile environments. The arrangement of the first fan at the opening increases flow of heat from inside to outside, thereby providing an improved transport of heat.

Embodiment include those where at least a second fan is arranged between the first and second shell. In such embodiments an increased flow the gaseous fluid between the shells is obtained and hence, an improved heat flow is also obtained. This is an issue when the surrounding environments are excessively hot.

Embodiments also comprise those where a temperature sensor is arranged inside the first shell and connected to a control unit. The control unit is configured to run at least said first fan when the temperature sensed by the temperature sensor exceeds a predetermined upper temperature limit. The control unit may also be configured to prevent at least the first fan from running when the temperature sensed by the temperature sensor is below a predetermined lower temperature limit.

In such embodiments, temperature control of the environment within the first shell is further facilitated. An advantage of this is that the at least first fan can be controlled to run only when needed, thereby preventing excessive power consumption as well as minimizing the total time that the at least first fan will run, considering the fact that a fan is a mechanical device with moving parts that have a limited operational lifetime.

The shells may be made of heat insulating and heat conducting materials such as plastic and metal. Embodiments include those where the first shell is made of a heat insulating material and embodiments include those where the second shell is made of a heat conducting material. A combination where the first shell is heat insulating and the second shell is heat conducting will result in a housing that is optimized with respect to efficient use of the at least first fan in both warm and cold environments.

In a second aspect, a system is provided that includes a housing according to the first aspect and a camera with a single electrical connection. This electrical connection provides for a electrical power, and a communication channel to the camera, and at least the at least first fan. Furthermore, the electric connection may be an Ethernet connection. An advantage of such a system is that, in addition to the advantages discussed above, a single electrical connection is capable of providing all necessary power to the system. For example, there is no need for a separate power connection.

BRIEF DESCRIPTION OF THE DRAWINGS

Embodiments will now be described with reference to the attached drawings, where.

DETAILED DESCRIPTION OF EMBODIMENTS

Figure 1A:
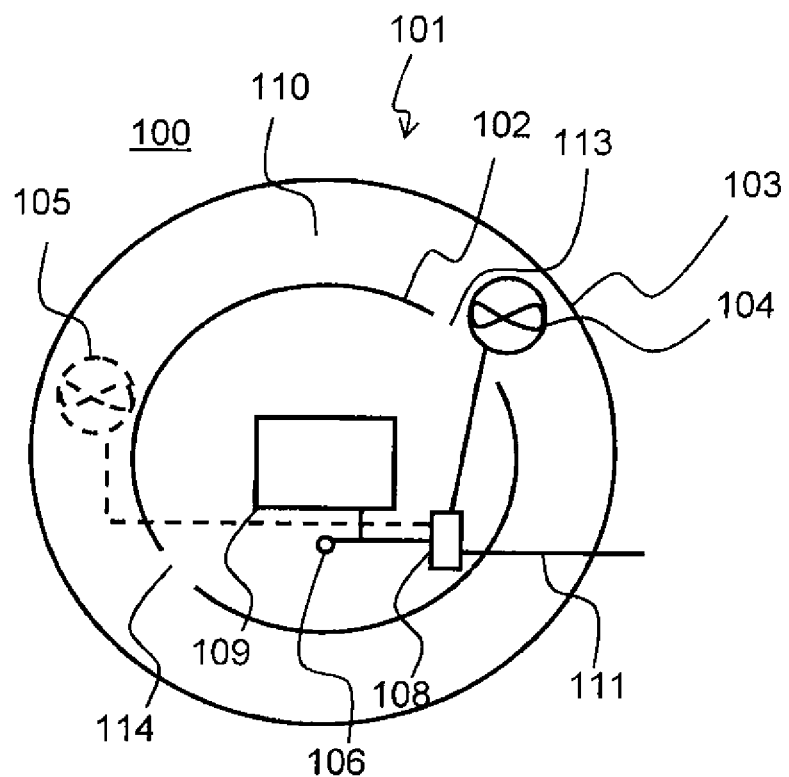
FIG. 1a schematically illustrates a cross sectional view of a housing.
Figure 1B:
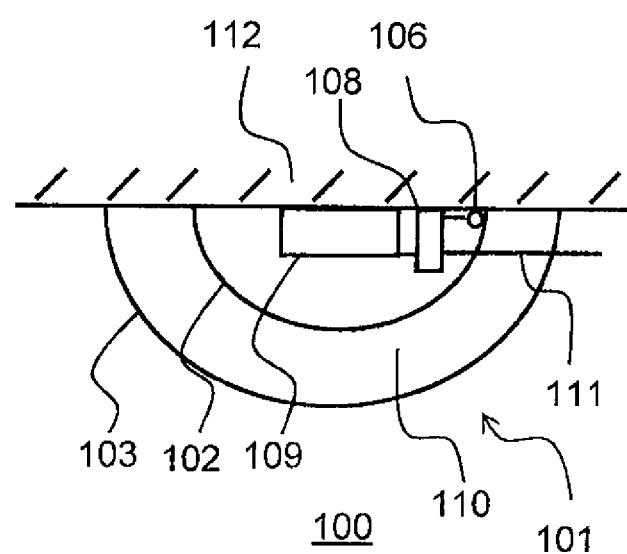
FIG. 1b schematically illustrates a cross sectional view of the housing of FIG. 1a when mounted.

FIGS. 1a and 1b schematically illustrate cross sectional views of a housing 101 for an electronic device that can be mounted on a wall or a ceiling 112. The housing 101 comprises a first shell 102 with an electronic device 109 arranged within the first shell 102. Outside of the first shell 102 is a second shell arranged 103, which covers the first shell 102. The arrangement of the shells 102, 103 creates a space 110 between the shells 102, 103. During operation the electronic device 109 will generate heat which will heat up a gaseous fluid which surrounds the electronic device 109. A first opening 113 and a second opening 114 in the first shell 102 are provided to enable flow of heated gaseous fluid from within the first shell 102 to the second shell 103 which is sealed from to the outside environment 100. The sealing of the second shell 103 may conform to a desired level according to the international protection rating (IP). For example, a housing of rating of IP66 will be dust tight as well as being tight when subjected to powerful jets of water.

In order to more effectively reduce the temperature of the gaseous fluid, a first fan 104 is arranged in the opening of the first shell 102. This enables an increased flow of gaseous fluid from within the first shell 102 and into the space 110 between the shells 102, 103.

A temperature sensor 106 is arranged within the first shell 102. The temperature sensor 106 is connected to a control unit 108, which is configured to run the first fan 104 when the temperature sensor 106 has sensed that the temperature within the first shell 102 exceeds a predetermined upper limit. The control unit 108 may be a separate unit, as shown in FIG. 1, or it may form part of the electronic device 109. When the first fan 104 is running the gaseous fluid will flow around the electronic device 109 and into the space 110 between the two shells 102, 103. The gaseous fluid will be heated when passing the electronic device 109 and cooled down when passing through the space 110 between the two shells 102, 103.

The control unit 108 may also be configured to prevent the first fan 104 from running when the temperature sensed by the temperature sensor 106 is below a predetermined lower temperature limit. When the first fan 104 is not running, the gaseous fluid will essentially be standing still in the space 110 between the two shells 102, 103 and thereby work as a heat insulator. This arrangement will minimize the heat loss of the gaseous fluid inside the first shell 102 to an outer cold environment 100.

As indicated by dashed lines a variation of the embodiment described above is one in which a second fan 105 is arranged in the space 110 between the first shell 102 and the second shell 103. This second fan 105 is connected to the control unit 108, and is configured to run when the temperature sensor 106 senses that the temperature exceeds a predetermined upper limit. As for the first fan 104, the second fan 105 is prevented from running when the temperature sensor 106 senses a temperature that is below a predetermined lower temperature limit.

As a consequence of the use of the second fan 105, the flow of gaseous fluid will increase in the space 110 between the first shell 102 and the second shell 103 when the outer environmental temperature is higher than a predetermined limit. Thus, both the first fan 104 and the second fan 105 will run, based on the sensing from the temperature sensor 106 as controlled by the control unit 108.

An Ethernet connection 111 is connected to the electronic device 109 and the control unit 108. The Ethernet connection 111 serves as a single power connection and as a communication channel between the device 109 and external equipment (not shown). With a suitably configured fan 104, having low power requirements, the Ethernet connection 111 is capable of providing all necessary power for the housing 101 with the electronic device 109, noting that the Power over Ethernet standard (IEEE 802.3af) imposes strict limitations on the power budget of a connected system.

The material of the shells is preferably a combination of plastic and metal. As summarized above, a combination where the first shell is made of a heat insulating material and the second shell is made of a heat conducting material will result in a housing 101 that is optimized with respect to efficient use of the at least first fan in both warm and cold environments.

Figure 2:
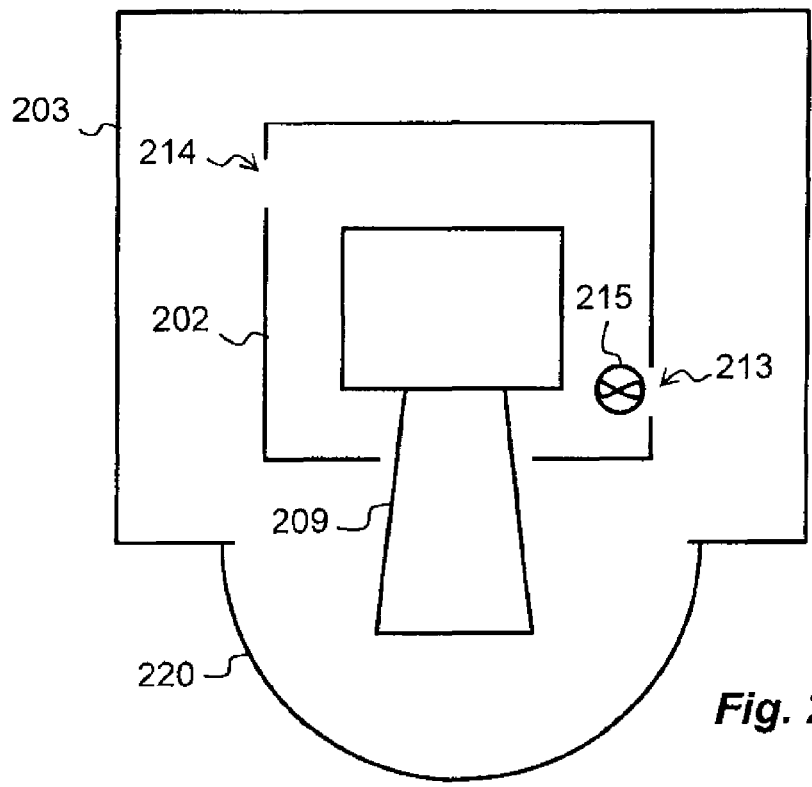
FIG. 2 is a cross sectional view that schematically illustrates an embodiment of a system with a camera.
Figure 3:
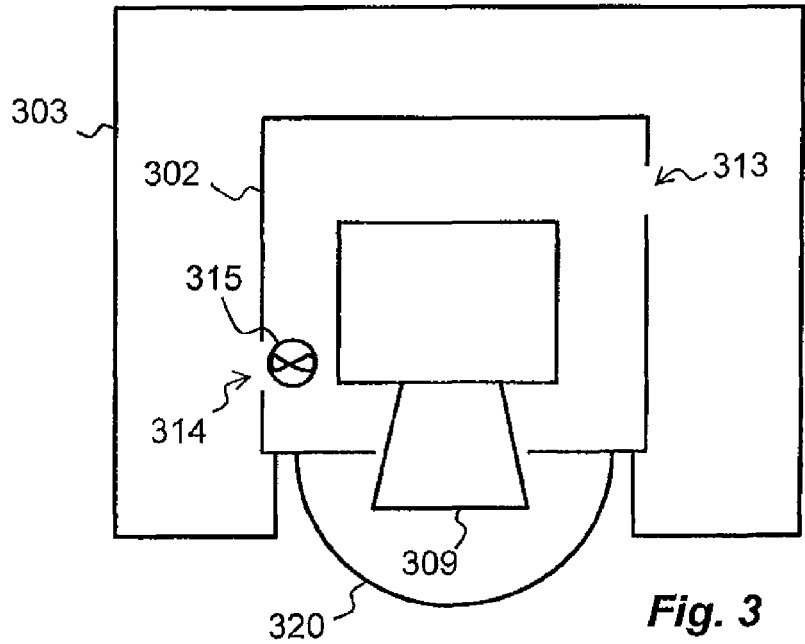
FIG. 3 is a cross sectional view that schematically illustrates another embodiment of a system with a camera.
Figure 4:
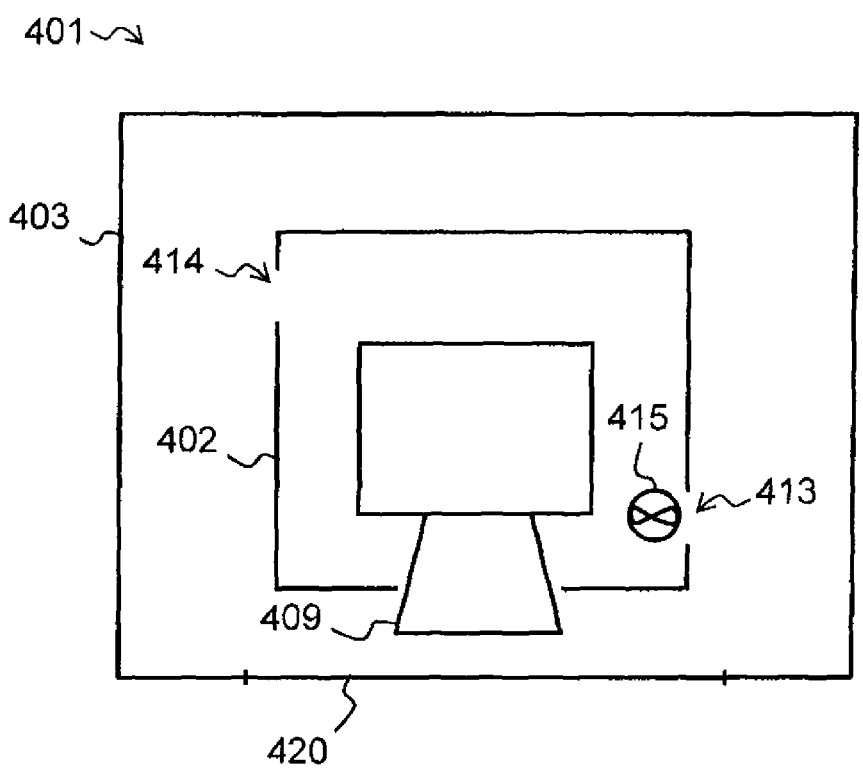
FIG. 4 is a cross sectional view that schematically illustrates yet another embodiment of a system with a camera.

Turning now to FIGS. 2, 3 and 4, embodiments of systems 201, 301, 401 comprising housings for electronic devices in the form of cameras will be illustrated. In FIG. 2 a first shell 202 partly encloses a camera 209. The first shell 202 is provided with a first opening 213 and a second opening 214. Heated air surrounding the camera 209 is circulated by means of a fan 215, as described above in connection with FIG. 1. A second shell 203 partly encloses the first shell 202. A transparent dome 220 is attached to the second shell 203. The dome 220 is attached to the second shell 203 such that it forms part of a housing of the system 201.

In FIG. 3 a first shell 302 partly encloses a camera 309. The first shell 302 is provided with a first opening 313 and a second opening 314. Heated air surrounding the camera 309 is circulated by means of a fan 315, as described above in connection with FIG. 1. A second shell 303 partly encloses the first shell 302. A transparent dome 320 is attached to the first shell 302. The dome 320 is attached to the first shell 302 such that it forms part of a housing of the system 301.

In FIG. 4 a first shell 402 partly encloses a camera 409. The first shell 402 is provided with a first opening 413 and a second opening 414. Heated air surrounding the camera 409 is circulated by means of a fan 415, as described above in connection with FIG. 1. A second shell 403 partly encloses the first shell 402. A "viewport" in the form of a flat transparent window 420 is attached to the second shell 403. The window 420 is attached to the second shell 403 such that it forms pail of a housing of the system 401.

As the skilled person will realize, the embodiments in FIGS. 2, 3 and 4 will typically also include respective temperature sensors, electric connections and control units, similar to the embodiment described above in connection with FIG. 1. Also, the choice of materials for the shells 202, 203, 302, 303, 402 and 403 will be similar to the embodiment described above in connection with FIG. 1.

The invention claimed is:

1. A system comprising a housing for an electronic device, the housing being sealed with respect to a surrounding environment, the housing comprising:
   a first shell made of a heat insulating material that at least partly encloses the electronic device, the first shell being arranged to allow a gaseous fluid to surround the electronic device, the first shell including at least one opening;
   a camera inside the first shell;
   a second shell made of a heat conducting material that encloses the first shell, and arranged in relation to the first shell such that the gaseous fluid may be present between the first and second shells; and
   at least a first fan arranged in relation to the first and second shells such that, when the fan is running, the fan is configured to provide a flow of the gaseous fluid through the at least one opening in the first shell of the gaseous fluid to the second shell and thereby provide heat transport from the electronic device to the second shell,
   wherein the fan is arranged in relation to the first and second shells such that, when the fan is not running, the gaseous fluid is essentially standing still between the first and second shells and thereby provides insulation from an outer cold environment.

2. The system according to claim 1, further comprising a single electric connection providing electrical power and a communication channel to the camera and at least the first fan.

3. The system according to claim 2, wherein the electric connection is an Ethernet connection.

4. The housing according to claim 1, wherein the first fan is arranged at the opening.

5. The housing according to claim 1, further comprising at least a second fan arranged between the first shell and the second shell.

6. The housing according to claim 4, further comprising at least a second fan arranged between the first shell and the second shell.

7. The housing according to claim 1, further comprising a temperature sensor arranged inside the first shell and connected to a control unit, the control unit configured to run at least the first fan when the temperature sensed by the temperature sensor exceeds a predetermined upper temperature limit.

8. The housing according to claim 4, further comprising a temperature sensor arranged inside the first shell and connected to a control unit, the control unit configured to run at least the first fan when the temperature sensed by the temperature sensor exceeds a predetermined upper temperature limit.

9. The housing according to claim 5, further comprising a temperature sensor arranged inside the first shell and connected to a control unit, the control unit configured to run at least the first fan when the temperature sensed by the temperature sensor exceeds a predetermined upper temperature limit.

10. The housing according to claim 6, further comprising a temperature sensor arranged inside the first shell and connected to a control unit, the control unit configured to run at least the first fan when the temperature sensed by the temperature sensor exceeds a predetermined upper temperature limit.

11. The housing according to claim 7, the control unit configured to prevent at least the first fan from running when the temperature sensed by the temperature sensor is below a predetermined lower temperature limit.

12. The housing according to claim 8, the control unit configured to prevent at least the first fan from running when the temperature sensed by the temperature sensor is below a predetermined lower temperature limit.

13. The housing according to claim 9, the control unit configured to prevent at least the first fan from running when the temperature sensed by the temperature sensor is below a predetermined lower temperature limit.

14. The housing according to claim 10, the control unit configured to prevent at least the first fan from running when the temperature sensed by the temperature sensor is below a predetermined lower temperature limit.

* * * * *